US012652990B2

(12) United States Patent
Lamouroux et al.

(10) Patent No.: US 12,652,990 B2
(45) Date of Patent: Jun. 9, 2026

(54) APPARATUS COMPRISING A REMOVABLE TOOL FOR INFILTRATION IN THE GAS PHASE

(71) Applicant: SAFRAN CERAMICS, Le Haillan (FR)

(72) Inventors: Franck Lamouroux, Moissy-Cramayel (FR); Jean-François Daniel René Potin, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 18/838,794

(22) PCT Filed: Feb. 7, 2023

(86) PCT No.: PCT/FR2023/050165
§ 371 (c)(1),
(2) Date: Aug. 15, 2024

(87) PCT Pub. No.: WO2023/156723
PCT Pub. Date: Aug. 24, 2023

(65) Prior Publication Data
US 2025/0154072 A1 May 15, 2025

(30) Foreign Application Priority Data
Feb. 17, 2022 (FR) ...................................... 2201409

(51) Int. Cl.
*H10P 72/00* (2026.01)
*C23C 16/04* (2006.01)
(Continued)

(52) U.S. Cl.
CPC ........ *H10P 72/0462* (2026.01); *C23C 16/045* (2013.01); *C23C 16/46* (2013.01);
(Continued)

(58) Field of Classification Search
CPC ............. H10P 72/0451; H10P 72/0452; H10P 72/0454; H10P 72/0462; H10P 72/0468;
(Continued)

(56) References Cited

U.S. PATENT DOCUMENTS

| | | | | |
|---|---|---|---|---|
| 4,941,429 A | * | 7/1990 | Wilkinson | .......... H10P 72/0402 |
| | | | | 118/733 |
| 10,731,252 B2 | | 8/2020 | Harris | |
| 2019/0360097 A1 | * | 11/2019 | Harris | ..................... C04B 41/87 |

FOREIGN PATENT DOCUMENTS

| | | |
|---|---|---|
| EP | 3 653 749 A1 | 5/2020 |
| FR | 3 021 671 A1 | 12/2015 |

(Continued)

OTHER PUBLICATIONS

FR3084737, machine translation. (Year: 2020).*
International Search Report as issued in International Patent Application No. PCT/FR2023/050165, dated Apr. 14, 2023.

*Primary Examiner* — Kurt Sweely
(74) *Attorney, Agent, or Firm* — CUSHMAN PARTNERS LLC

(57) ABSTRACT
A removable tool for consolidation or densification in the gas phase of at least one fibrous preform configured to be arranged in an oven, the removable tool including a homogenization chamber including at least one gas inlet orifice and a depletion chamber including at least one gas outlet orifice, the removable tool further including a reaction chamber arranged between the homogenization chamber and the depletion chamber and configured to receive at least one fibrous preform, the reaction chamber being separated from the homogenization chamber and the depletion chamber by perforated plates.

4 Claims, 3 Drawing Sheets

(51) Int. Cl.
      *C23C 16/458*       (2006.01)
      *C23C 16/46*        (2006.01)
      *H10P 72/10*        (2026.01)

(52) U.S. Cl.
      CPC ...... *C23C 16/4587* (2013.01); *H10P 72/0454*
               (2026.01); *H10P 72/0456* (2026.01); *H10P*
                                      *72/15* (2026.01)

(58) Field of Classification Search
      CPC ....... H10P 72/0478; H10P 72/19–1926; H10P
               72/3212; H10P 72/3218; H10P 72/3311;
               H01L 21/67155; H01L 21/67161; H01L
               21/67167; H01L 21/6719; H01L 21/6735;
               H01L 21/67363; H01L 21/67383; H01L
                    21/67386; H01L 21/67389; H01L
               21/67393; H01L 21/677; H01L 21/67703;
               H01L 21/67721; H01L 21/6773; H01L
               21/67754; C23C 16/045; C23C 16/46;
                                      C23C 16/4587
      See application file for complete search history.

(56)                   References Cited

FOREIGN PATENT DOCUMENTS

| | | | | |
|---|---|---|---|---|
| FR | 3 059 679 | A1 | 6/2018 | |
| FR | 3084737 | A1 * | 2/2020 | ............... F27B 5/04 |
| FR | 3 107 283 | A1 | 8/2021 | |
| WO | WO 2015/044562 | A1 | 4/2015 | |
| WO | WO 2018/104640 | A1 | 6/2018 | |

* cited by examiner

[Fig. 1]
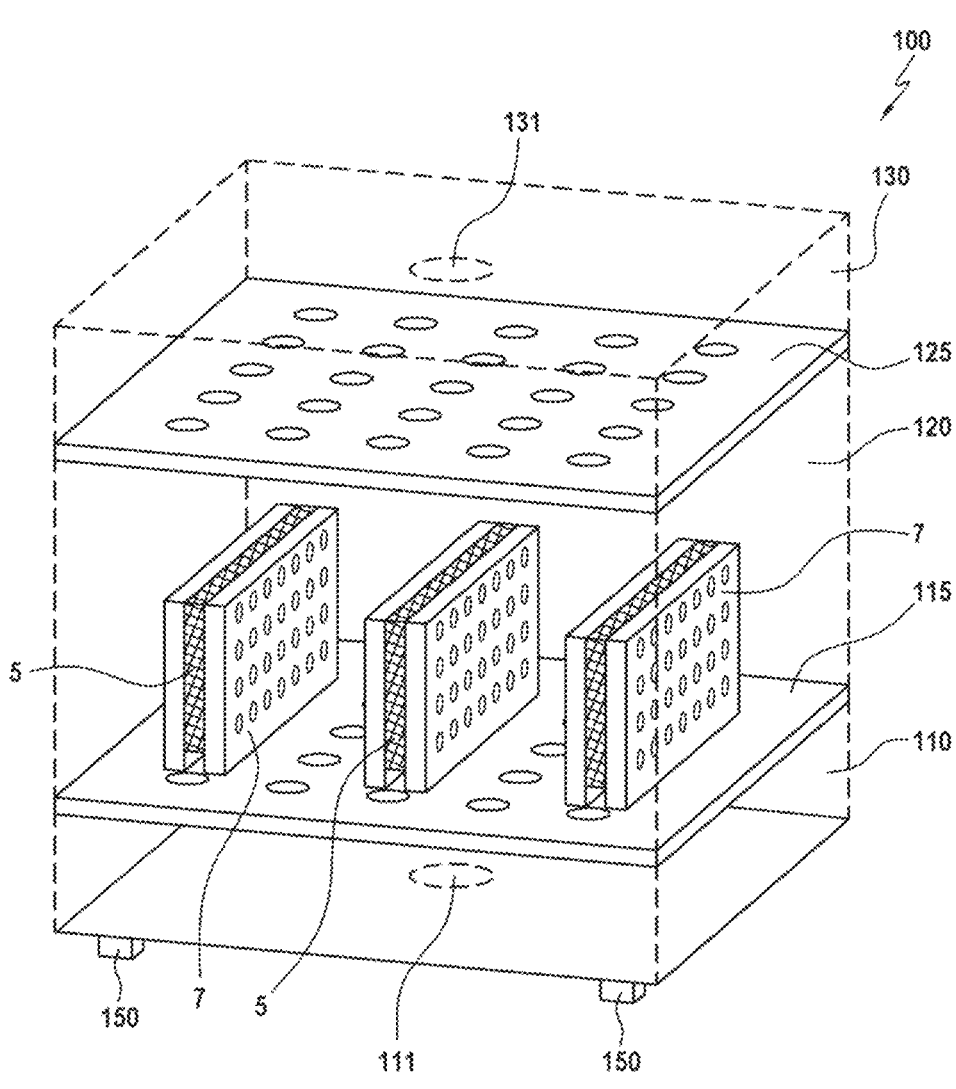

[Fig. 2]
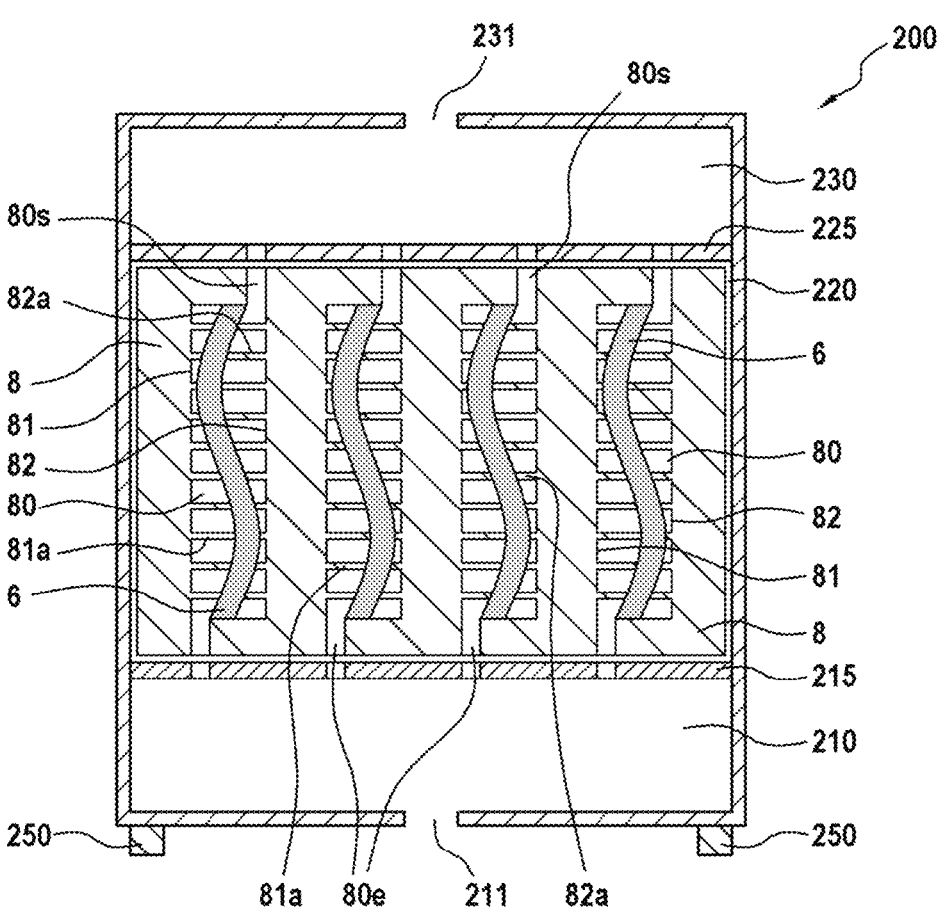
[Fig. 3]
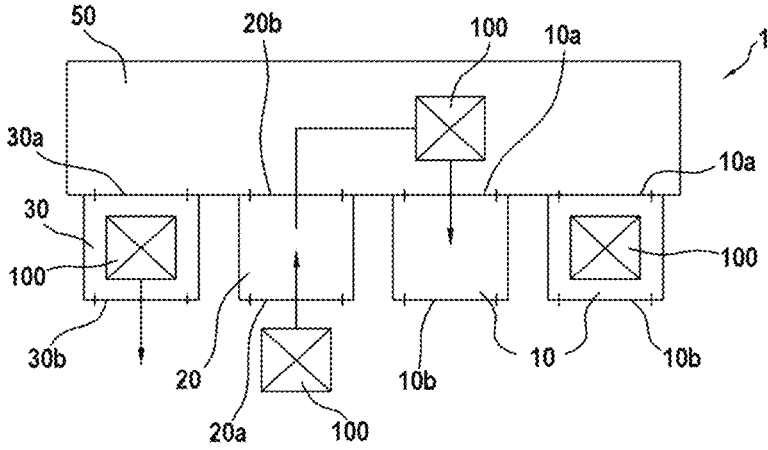

[Fig. 4]
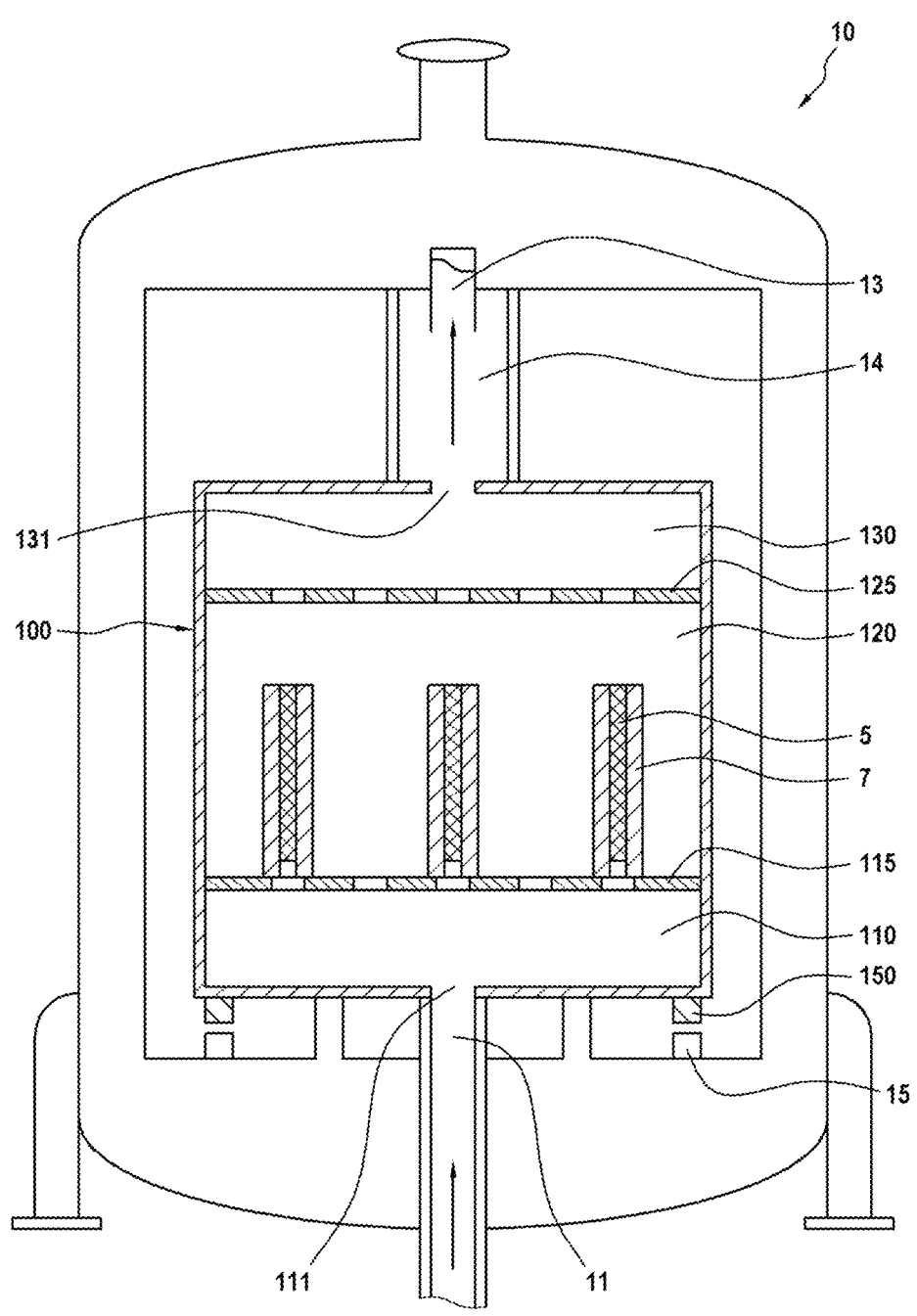

APPARATUS COMPRISING A REMOVABLE TOOL FOR INFILTRATION IN THE GAS PHASE

CROSS-REFERENCE TO RELATED APPLICATIONS

This application is the U.S. National Stage of PCT/FR2023/050165, filed Feb. 7, 2023, which in turn claims priority to French patent application number 2201409 filed Feb. 17, 2022. The content of these applications are incorporated herein by reference in their entireties.

TECHNICAL FIELD

The present invention relates to the manufacture of parts made of composite material and, more particularly, to the installation and tools used during the consolidation or densification by chemical infiltration in the gas phase of a fibrous preform intended to form at least the reinforcement of the composite material part.

PRIOR ART

Consolidation or densification by chemical infiltration in the gas phase, also called "CVI" from "chemical vapor infiltration", is conventionally carried out by loading the fibrous preform(s) to be consolidated or densified in an oven. Such an oven is described in particular in documents WO 2018/104640 A1 and WO 2015/044562 A1.

The oven usually comprises a reactive gas injection zone containing one or more gas precursors of the material constituting the matrix. These reactive gases are then introduced into a homogenization zone of the oven, allowing to homogenize the temperature and the composition of said gases, before entering a reaction zone in which the preforms to be densified or consolidated are arranged.

The temperature and pressure in the oven are adjusted to allow the reactive gas to diffuse within the porosities of the fibrous preforms. The reactive gas can thus form a deposition of the material constituting the matrix by decomposition of one or more constituents of the reactive gas or reaction between several constituents, these constituents forming the precursor of the matrix.

Then, the gases enter a depletion zone, within which said gases finish being consumed, before being evacuated through an ejection zone of the gases produced.

However, this consolidation or densification technique involves long production cycles, especially in comparison to the time actually used to densify or consolidate the preform. Indeed, before being able to proceed with the densification or consolidation strictly speaking, it is necessary to load the fibrous preform(s) into the oven, measure the leak rate of the oven and heat the oven to reach the desired temperature. Once the densification or consolidation step has been completed, it is still necessary to cool the oven, unload the part(s), then clean and prepare the oven for the next cycle.

Disclosure of the Invention

The present invention aims at overcoming the disadvantages described above.

For this purpose, the invention proposes a removable tool for consolidation or densification in the gas phase of at least one fibrous preform configured to be arranged in an oven, the removable tool being characterized in that it comprises a homogenization chamber comprising at least one gas inlet orifice and a depletion chamber comprising at least one gas outlet orifice, the removable tool further comprising a reaction chamber arranged between the homogenization chamber and the depletion chamber and configured to receive at least one fibrous preform, the reaction chamber being separated from the homogenization chamber and the depletion chamber by perforated plates.

"Homogenization chamber" means a chamber configured to homogenize the composition and temperature of the gas(es) entering through the gas inlet orifice(s). "Depletion chamber" means a chamber configured to deplete the gas(es) before their exit through the gas outlet orifice(s). "Oven", preferably designates an oven configured for operations of chemical infiltration in the gas phase.

Thus, the removable tool according to the invention allows to greatly increase the time during which the oven for chemical infiltration in the gas phase is available to effectively carry out densification or consolidation operations. Indeed, the homogenization, reaction and depletion zones are the zones that require recurring cleaning and maintenance, because they are the zones most exposed to reactive gases. By using removable tools directly integrating the homogenization zone, the reaction zone and the depletion zone, it is possible to carry out recurring cleaning, maintenance and preparation operations without immobilizing the oven. Thus, the cleaning and preparation steps can be carried out on a first removable tool while the oven is simultaneously used, for example to densify or consolidate fibrous preforms using a second removable tool.

Furthermore, thanks to such removable tools, it is possible to maintain the oven at the correct temperature and pressure conditions by loading and unloading the removable tools. It is therefore no longer necessary to carry out the steps of heating and cooling the oven, the oven remaining at temperature, while the removable tools are heated or cooled separately.

Thus, thanks to such removable tool, the use of the oven for chemical infiltration in the gas phase is almost exclusively limited to the densification or consolidation operation, thus greatly increasing the possible production rate.

Moreover, the use of such removable tool allows a saving of reactive gases, because the reaction zone—here limited to the reaction chamber—is very limited in size. This reduction in reactive gas consumption also allows a reduction in costs related to the installation, by allowing a more modest sizing of the furnace, in particular concerning the vacuum group or the effluent treatment unit.

According to another particular characteristic of the invention, the removable tool is made at least partially of conductive material and comprises electrical connection terminals.

Thus, the removable tool can be connected to electrical terminals present in the oven, so as to act as a resistance. The removable tool may thus be capable of heating the fibrous preforms present in its reaction chamber and possibly the reactive gas(es) present in said removable tool.

According to a particular characteristic of the invention, the removable tool is made of graphite.

The invention also relates to a load configured to be arranged in an oven, said load comprising a removable tool according to the invention and at least one fibrous preform arranged in the reaction chamber of the removable tool.

According to a particular characteristic of the invention, the load comprises at least one shaper in which the fibrous preform is held, the shaper being arranged in the reaction chamber of the removable tool.

Thus, the fibrous preform(s) can be arranged freely in the reaction chamber of the removable tool, or be held in one or more shapers.

According to a particular characteristic of the invention, said at least one shaper comprises a plurality of shaping housings, each shaping housing being formed by a first surface and a second surface facing each other and being intended to accommodate a fibrous preform, each first or second surface comprising holding elements projecting relative to said surface and extending to an end face intended to be in contact with the fibrous preform, each shaping housing extending between at least one gas inlet and at least one gas outlet positioned between the first surface and the second surface of said housing.

"End face" means the surface of the holding element which is actually in contact with the fibrous preform placed in the shaping housing. Thus, the entire end face of a holding element must be in contact with the fibrous preform when the latter is placed in the shaping housing.

Such a shaper is perfectly suited to a removable tool according to the invention, and allows to further reduce the consumption of reactive gases while increasing the amount of fibrous preforms which can be consolidated or densified simultaneously. Furthermore, this type of shaper without perforations requires little maintenance and cleaning operations, while being more robust.

The invention further relates to an installation for consolidation or densification by chemical infiltration in the gas phase comprising at least one removable tool according to the invention, said installation further comprising at least one CVI oven comprising at least one gas injector and a gas evacuation system, the CVI oven being able to receive the removable tool so that at least one gas inlet orifice of the removable tool is connected to at least one gas injector of the CVI oven, the CVI oven being configured to heat or thermally insulate said removable tool.

"CVI oven", means a CVI, for "chemical vapor infiltration", type oven that is to say an oven configured for carrying out an operation of infiltration in the gas phase.

The presence of several CVI ovens in the installation allows to increase the production rate, but can also offer greater flexibility and allow more variations in carrying out consolidation and densification methods, or even in carrying out mixed methods. Thus, the same loaded removable tool can be placed successively in two CVI ovens, having for example different conditions of temperature, pressure or composition of the injected gas(es).

According to a particular characteristic of the invention, in the case where the removable tool is made at least partially of conductive material and comprises electrical connection terminals, the CVI oven further comprises electrical connection terminals, the CVI oven being suitable to receive the removable tool so that the electrical connection terminals of the CVI oven are connected to the electrical connection terminals of the removable tool.

Thus, the removable tool can act as a resistance, and thus be capable of heating the fibrous preforms present in its reaction chamber and possibly the reactive gas(es) present in said removable tool.

According to a particular characteristic of the invention, the installation further comprises at least one preheating oven capable of receiving a removable tool according to the invention and configured to preheat or thermally insulate said removable tool.

The presence of a preheating oven allows to carry out preheating, that is to say heating, or even pressurizing, the removable tool loaded with the fibrous preform(s) without requiring the blocking of a CVI furnace configured for consolidation or densification in the gas phase. The CVI oven(s) can thus be devoted to the consolidation or densification step itself, the preheating of the loads being carried out in the preheating oven(s). Production rates can thus be increased.

According to another particular characteristic of the invention, the installation further comprises at least one cooling cell capable of receiving a removable tool according to the invention and configured to cool said removable tool.

The presence of a cooling cell allows to cool the removable tool loaded by the consolidated or densified part(s) without requiring the blocking of a CVI oven configured for consolidation or densification in the gas phase. The CVI oven(s) can thus be devoted to the consolidation or densification step itself, the cooling of the consolidated or densified parts being carried out in the cooling cell(s). Production rates can thus be increased.

The removable tool therefore conventionally leaves the installation according to the invention from the cooling cell. However, the cooling cell can also be the entrance from which the removable tool enters the installation according to the invention. Indeed, by loading the removable tool into the cooling cell before passing it through a transfer tunnel into a preheating oven or into a CVI oven, the thermal losses of the preheating oven or the CVI oven are limited compared to if said preheating or CVI oven was directly open to the outside.

According to another particular characteristic of the invention, the installation comprises at least one transfer tunnel configured to allow the movement of the removable tool at least between the CVI oven and another CVI oven, a preheating oven or a cooling cell.

The use of such a transfer tunnel allows to easily move the removable tool between the CVI oven(s), the preheating oven(s) and the cooling cell(s).

Preferably, the transfer tunnel comprises at least two openings, and forms a closed passage allowing the movement of the shaping tool. Preferably, each opening of transfer tunnel is able to form a sealed contact with the door of the CVI oven, the preheating oven or the cooling cell.

Preferably, the transfer tunnel is made at least partially from an adiabatic material, that is to say from a material preventing the exchange of heat between the exterior and the interior of the tunnel. Thus, by limiting the heat losses of the removable tool during its passage through the transfer tunnel, its temperature is maintained, which is particularly advantageous in the case of a transfer between two ovens of the installation.

The installation therefore has a modular configuration, each CVI oven, each preheating oven and each cooling cell corresponding to a module. Such an architecture with several modules allows great flexibility in carrying out methods of chemical infiltration in the gas phase. Thus, a loaded removable tool can move from one module to another easily, depending on the steps to be carried out.

The invention also relates to a use of an installation for consolidation or densification by chemical infiltration in the gas phase comprising at least one CVI oven, a preheating oven and a cooling cell, the CVI oven comprising at least one gas injector and a gas evacuation system, the use comprising:

placing a load according to the invention in the preheating oven, and preheating said load, then placing the load in the CVI oven so that at least one gas inlet orifice of the removable tool of the load is connected to at least one gas injector of the CVI oven, then consolidation or densification by infiltration in the gas phase of a matrix of the fibrous preform(s) present in the load, then placing the load in the cooling cell, and cooling said load, then removing the load from the cooling cell.

Then, the part(s) consolidated or densified by the matrix can be removed from the removable tool.

The use described here represents a conventional use of the consolidation or densification installation. Of course one does not depart from the scope of the invention if additional steps are added.

More generally, the invention relates to the use of an installation for consolidation or densification by chemical infiltration in the gas phase comprising at least one CVI oven, the CVI oven comprising at least one gas injector and a gas evacuation system, the use comprising:

placing a load according to the invention in the CVI oven so that at least one gas inlet orifice of the removable tool of the load is connected to at least one gas injector of the CVI oven, then consolidating or densifying, by gas phase infiltration of a matrix, the fibrous preform(s) present in the load, then removing the load from the CVI oven.

According to a particular characteristic of the invention, the use of the installation further comprises, before placing the load in the CVI oven, placing the load in a preheating oven, then preheating said load.

According to another particular characteristic of the invention, the use of the installation further comprises, after the consolidation or densification step by infiltration in the gas phase, the placement of the load in a cooling cell, then the cooling of said load.

In the case where the previous use concerns the consolidation of fibrous preforms, an additional densification step can be carried out by gas, liquid or solid means in a well-known manner to obtain a composite material part. The additional gas densification step can be carried out using a removable tool or the installation according to the invention.

BRIEF DESCRIPTION OF THE DRAWINGS

FIG. 1 is a schematic transparent perspective view of a load comprising a removable tool according to the invention.

FIG. 2 is a schematic sectional view of a loading variant comprising a removable tool according to the invention.

FIG. 3 is a simplified schematic view of an installation according to the invention.

FIG. 4 is a schematic sectional view of a CVI oven of the installation according to the invention comprising a load.

DESCRIPTION OF THE EMBODIMENTS

The present invention applies to the manufacture of parts made of composite material and in particular of the SiC/SiC or C/SiC type. More particularly, the invention finds an advantageous application during the consolidation or densification by chemical infiltration in the gas phase of fibrous preforms.

FIG. 1 schematically illustrates an example of a load comprising a removable tool 100 accommodating several fibrous preforms 5 arranged in shapers 7.

The removable tool 100 comprises a homogenization chamber 110 of the gas(es), which has at least one gas inlet orifice 111. The homogenization chamber 110 is delimited by a first perforated plate 115, on the side of the chamber opposite the gas inlet orifice(s) 111. The homogenization chamber 110 is configured to homogenize the temperature and composition of the gas(es) entering said chamber 110 through the gas inlet orifice(s) 111.

The removable tool 100 also comprises a depletion chamber 130 of the gas(es), within which the reactive species of the gas(es) finish being consumed, which has at least one gas outlet orifice 131. The depletion chamber 130 is delimited by a second perforated plate 125, on the side of the chamber opposite the gas outlet orifice(s) 131. The depletion chamber 130 is configured to deplete the reactive gas(es) with the purpose of avoiding the deposition of condensable species at the outlet of the removable tool 100.

The removable tool 100 further comprises a reaction chamber 120 extending between the first perforated plate 115 and the second perforated plate 125. Thus, the homogenization chamber 110 and the depletion chamber 130 are arranged on either side of the reaction chamber 120. The reaction chamber 120 is configured to receive at least one fibrous preform 5, which may or may not be arranged in a shaper 7. The perforations of the first plate 115 are arranged so as to allow a sufficient supply of gas at the fibrous preform(s) 5 present in the reaction chamber 120, in particular when the fibrous preform(s) 5 are held by one or more shapers 7.

The shaper(s) 7 can for example be multi-perforated shapers. Such shapers are described in particular in documents FR 3 021 671 A1 or FR 3 059 679 A1. The shaper(s) may also comprise a shaping housing having non-perforated interior surfaces, but provided with grooves or holding elements on which the fibrous preform arranged in the shaping housing can rest. A gas inlet located at one end of the shaping housing allows the gas to penetrate inside the shaper, which can then circulate in contact with the fibrous preform in the grooves or between the holding elements. The gas is then evacuated through a gas outlet located at the other end of the shaping housing. Such a shaper is for example described in document FR 3 107 283.

According to a particular embodiment of the invention, FIG. 2 schematically illustrates an example of load comprising a removable tool 200 accommodating several fibrous preforms 6 arranged in a single multiple shaper 8, this load having a particularly advantageous configuration for large-scale manufacturing.

As previously, the removable tool 200 comprises a homogenization chamber 210 of the gas(es), which has at least one gas inlet orifice 211. The homogenization chamber 210 is delimited by a first perforated plate 215, on the side of the chamber opposite the gas inlet orifice(s) 211. The removable tool 200 also comprises a depletion chamber 230 of the gas(es), which has at least one gas outlet orifice 231. The depletion chamber 230 is delimited by a second perforated plate 225, on the side of the chamber opposite the gas outlet orifice(s) 231.

The reaction chamber 220 of the removable tool 200 extends between the first perforated plate 215 and the second perforated plate 225. A large part of the volume of the reaction chamber 220 is occupied by a multiple shaper 8 comprising a plurality of shaping housings 80, each shaping housing 80 being configured to accommodate a fibrous preform 6. Thus, the number of fibrous preforms that can be loaded into the removable tool is greatly increased.

The shaper 8 illustrated in FIG. 2 comprises, by way of example, four shaping housings 80. Of course one does not depart from the scope of the invention if the shaper comprises two, three or more than four shaping housings.

Each shaping housing 80 is formed by a first surface 81 and a second surface 82 facing the first surface 81. In the configuration presented in FIG. 2, the shaper 8 is in the form of a structural enclosure comprising a start plate, three intermediate plates and one end plate. The intermediate plates separate and delimit the shaping housings 80 from each other. The start and end plates allow to close the shaping housings 80 located at the ends of the shaper 8. The fibrous preforms 6 are inserted in the shaping housings 80 between the start plate, the intermediate plates and the end plate.

Thus, the first surface 81 of each shaping housing 80 belongs to the start plate or to an intermediate plate. The second surface 82 of each shaping housing 80 belongs to an intermediate plate or to the end plate. Each intermediate plate thus comprises the first surface 81 of a housing 80 and the second surface 82 of an adjacent housing 80.

Each shaping housing 80 extends along its first surface 81 and its second surface 82 between a first end and a second end. Each shaping housing 80 comprises at least one gas inlet 80e positioned at the first end of said shaping housing 80, and opening into the shaping housing 80 between the first surface 81 and the second surface 82 of said housing 80. Each shaping housing 80 further comprises at least one gas outlet 80s positioned at the second end of said shaping housing 80, and opening into the shaping housing 80 between the first surface 81 and the second surface 82 of said housing 80.

Preferably, the first ends of all the shaping housings 80 are located on one side of the shaper 8 and the second ends of all the shaping housings 80 are located on another side of said shaper 8. Thus, preferably, the gas inlets 80e of the shaper 8 are all located on the same side, and the gas outlets 80s of the shaper 8 are all located on the same side, opposite that of the gas inlets 80e. This allows to facilitate the arrangement of the shaper 8 in the removable tool 200, and the possible connections of the gas inlets and outlets.

The perforations of the first perforated plate 215 are adapted to the gas inlets 80e of the shaper 8. Preferably, as illustrated in FIG. 2, the perforations of the first perforated plate 215 coincide with the gas inlets 80e of the shaper 8. Thus, when the shaper 8 is arranged in the removable tool 200, the gas inlets 80e of the shaper 8 are located in the extension of the perforations of the first perforated plate 215.

The perforations of the second perforated plate 225 are adapted to the gas outlets 80s of the shaper 8. Preferably, as illustrated in FIG. 2, the perforations of the second perforated plate 225 coincide with the gas outlets 80s of the shaper 8. Thus, when the shaper 8 is arranged in the removable tool 200, the gas outlets 80s of the shaper 8 are located in the extension of the perforations of the second perforated plate 225.

By using a single shaper 8 rather than a plurality of shapers 7, it is possible to load more fibrous preforms into the removable tool 200. Furthermore, the use of such a shaper 8 allows to reduce the amount of necessary reactive gas, the reactive gas(es) circulating in the reaction chamber 220 being immediately in contact with the fibrous preforms 6. The load illustrated in FIG. 2 is therefore particularly economical and suitable for large series production.

According to a particular embodiment of the invention illustrated in FIG. 2, when a fibrous preform 6 is arranged in a shaping housing 80 of the shaper 8, the gas inlet(s) 80e of the housing 80 are only located between the first surface 81 of said housing and the preform 6, at the first end of the shaping housing 80. Furthermore, the gas outlet(s) 80s of the housing 80 are only located between the second surface 82 of said housing and the preform 6, at the second end of the housing 80. It is of course possible to reverse the role of the first surface of the housing and the second surface of the housing without departing from this embodiment.

According to another particular embodiment of the invention, when a fibrous preform is arranged in a shaping housing of the shaper, the gas inlet(s) of the shaping housing can be located both between the first surface of the housing and the preform, and between the second surface of the housing and the preform, at the first end of the shaping housing. Furthermore, the gas outlet(s) of the shaping housing may be located both between the first surface of the housing and the preform, and between the second surface of the housing and the preform, at the second end of the shaping housing.

Each first or second surface 81, 82 of each shaping housing 80 has holding elements 81a, 82a projecting relative to said surface 81, 82. These holding elements 81a, 82a can be in the form of prominences or reliefs extending from the first or second surface 81, 82 towards the opposite surface. These holding elements 81a, 82a thus extend to an end face, intended to be in contact with the fibrous preform 6 placed in the shaping housing 80.

When a fibrous preform 6 is arranged in a shaping housing 80 of the shaper 8, the holding elements 81a, 82a of the shaping housing 80 extend between the fibrous preform 6 and the first or second surface 81, 82. Gas can thus circulate between the fibrous preform 6 and the first or second surface 81, 82 of the shaping housing 80 during the consolidation or densification step.

At least a portion of the surface holding elements may have a frustoconical shape, and preferably frustoconical of revolution. At least a portion of the elements for maintaining a surface can have a shape which is cylindrical, and preferably cylindrical of revolution, as is the case in the example illustrated in FIG. 2. At least a portion of the elements for maintaining a surface can have a polyhedron shape, preferably having two trapezoid-shaped faces, or even four trapezoid-shaped faces distinct from the end face. The holding elements can be in the shape of grooves defining reactive gas flow channels.

Preferably, at least a portion of the holding elements have a section gradually decreasing from their junction with the first or second surface to their end face. Such a progressive reduction in the section of the holding elements according to their direction of extension allows to give them better robustness, while obtaining an end face with the smallest possible area for contact with the fibrous preform.

Preferably, the sum of the areas of the end faces of the holding elements of the first or second surface is less than or equal to 50% of the total area of said surface, in order to expose the largest possible surface of the fibrous preform 5 to the reactive gas. Preferably, the sum of the areas of the end faces of the holding elements of the first or second surface is less than or equal to 40% of the total area of said surface, and preferably greater than or equal to 5% of the total area of said surface.

Preferably, the area of the end face of at least a portion of the holding elements is comprised between 1 mm$^2$ and 50 mm$^2$. Preferably, the area of the end face of at least a portion of the holding elements is comprised between 2.5 mm$^2$ and 15 mm$^2$.

According to another embodiment of the invention, the contact between at least a portion of the holding elements and the fibrous preforms is said to be punctual, that is to say that the end face area of at least a portion of the holding elements is less than 1 mm$^2$. At least a portion of the holding elements may have, for example, the overall shape of a needle, a straight rod, a rod curved into an arc or a "C" shape.

Of course one does not depart from the scope of the invention if the holding elements have another shape or geometry, other dimensions, or a distribution different from those described in the present example. In particular, the holding elements can form varied groups between two surfaces, or even within the same surface.

Preferably, the removable tool 100 or 200 is made of graphite. According to a particular embodiment of the invention, the removable tool 100 or 200 is made of a conductive material capable of withstanding the conditions imposed for densification or consolidation by chemical infiltration in the gas phase, such as for example graphite, and the removable tool 100 or 200 is equipped with electrical connection terminals 150 or 250. Thus, the removable tool 100 or 200 can act as a resistance and can therefore heat the fibrous preform(s) 5 or 6 present in the reaction chamber 120 or 220 as well as the gases present in the removable tool 100 or 200.

Each fibrous preform 5 or 6 arranged in the removable tool 100 or 200 corresponds to a "dry" fibrous texture, that is to say not impregnated with a resin or the like. Each fibrous preform 5 or 6 may include a plurality of threads of various types, in particular ceramic or carbon threads or else a mixture of such threads. Preferably, each fibrous preform 5 or 6 can be made from silicon carbide fibers. In general, each fibrous preform 5 or 6 can also be made from fibers consisting of the following materials: alumina, mullite, silica, an aluminosilicate, a borosilicate, carbon, or a mixture of several of these materials.

Each fibrous preform 5 or 6 can be obtained from at least one textile operation using ceramic and/or carbon threads. Each preform 5 or 6 can be produced by stacks of layers or folds obtained by two-dimensional weaving (2D). "Two-dimensional weaving", means here a conventional weaving method by which each weft thread passes from one side to the other of threads of a single warp layer or vice versa.

Each fibrous preform 5 or 6 can, in particular, be obtained by multilayer or three-dimensional weaving of the threads. "Three-dimensional weaving" or "3D weaving", must be understood as a mode of weaving by which at least some of the warp threads bind weft threads on several weft layers. A reversal of roles between warp and weft is possible.

Each fibrous preform 5 or 6 can also be produced by layers of unidirectional fibers (UD) which can be obtained by automated fiber placement (AFP), or by linear winding.

It is also possible to start from fibrous textures such as two-dimensional fabrics or unidirectional webs (UD), and to obtain each fibrous preform 5 or 6 by draping such fibrous textures on a form. These textures can optionally be linked together for example by sewing, by implantation of wires or rigid elements, or by needling to form the fibrous preform 5 or 6.

FIG. 3 schematically illustrates a gas phase consolidation or densification installation 1 comprising a plurality of modules 10, 20 and 30. Each module corresponds to a CVI oven 10, a preheating oven 20 or a cooling enclosure 30.

The removable tool 100 or 200 is configured to be arranged in a module 10, 20, 30 of the gas phase consolidation or densification installation 1, and in particular in an oven 10, 20. Preferably, the removable tool 100 or 200 is configured to be arranged in each of the modules 10, 20, 30 of the installation 1, and consequently in each of the ovens 10, 20 of the installation 1. Preferably, the removable tool 100 or 200 is arranged in a module 10, 20, 30 of the installation 1 via a door 10a, 20a, 30a belonging to said module 10, 20, 30.

As illustrated in FIG. 3, the modules 10, 20, 30 can also comprise at least one other door 10b, 20b, 30b, allowing to facilitate maintenance operations, or to remove the removable tool through a door other than that through which it was loaded.

Preferably, the installation 1 comprises several removable tools 100 or 200. Thus, when a removable tool 100 or 200 must be cleaned and prepared for a next cycle, one or more other removable tools 100 or 200 can be used to be able to continue to densify or consolidate preforms 5 or 6. Consequently, the recurring steps of cleaning the densification or consolidation tool 100 or 200 can be carried out while the oven(s) 10 are operating to consolidate or densify other parts.

In order to be able to move the removable tool 100 or 200 from one module 10, 20, 30 to another, the installation 1 may comprise one or more transfer tunnels 50 specially adapted to said removable tool 100 or 200. Each transfer tunnel 50 comprises at least a first opening and a second opening, each opening being configured to create a sealed contact between the door 10a, 20b, 30a of a module 10, 20, 30 of the installation 1 and said transfer tunnel 50. Thus, each transfer tunnel 50 allows to create a passage between at least two modules 10, 20, 30 of the installation 1, the passage being preferably gas-tight.

Preferably, the transfer tunnel 50 is made at least partially in an adiabatic material, that is to say limiting the heat exchanges between the exterior and the interior of the tunnel 50. It is thus, for example, possible to transfer removable tools 100 or 200 from one module 10, 20, 30 to the other with limited heat loss. The transfer tunnel(s) 50 may be fixed between at least two modules 10, 20, 30. The transfer tunnel(s) 50 may also be removable and may be moved so as to join different modules 10, 20, 30 as required. In the example illustrated in FIG. 3, the installation 1 comprises only one fixed transfer tunnel 50, which connects all the modules 10, 20, 30 of the installation 1.

As illustrated in FIG. 3, the installation 1 comprises at least one CVI oven 10 for consolidation or densification by gas phase infiltration. Preferably, the installation 1 comprises at least two CVI ovens 10 for consolidation or densification by gas phase infiltration. The use of several CVI ovens 10 allows to use different gases or gas mixtures, and to have greater flexibility for the implementation of the methods.

FIG. 4 illustrates an example of a CVI oven 10, in which a load is arranged comprising a removable tool 100 and at least one fibrous preform 5. Each CVI oven 10 comprises at least one gas injector 11, preferably in the form of a graphite tube. When the removable tool 100 is placed in a CVI oven 10, the gas inlet orifice(s) 111 of the removable tool 100 are placed in the extension of the gas injector(s) 11 of said oven 10. Preferably, the connection between the gas inlet orifice(s) 111 of the removable tool 100 and the gas injector(s) 11 of said oven 10 is sealed. Thus, the escape of reactive gases into the enclosure of the oven 10 is limited, outside the removable tool 100. The clogging of the oven 10 is therefore strongly limited, allowing to considerably reduce the duration and frequency of maintenance and cleaning operations for the CVI oven 10.

Each CVI oven 10 may further comprise an ejection cone 13 connected to a pumping system 12. When the removable tool 100 is placed in a CVI oven 10, the gas outlet(s) 131 of the removable tool 100 are placed opposite the ejection cone 13 of said oven 10. Preferably, each CVI oven 10 comprises a chimney 14 allowing to suck in the gas leaving the removable tool 100 as close as possible to the gas outlet orifice(s) 131 of the removable tool 100. This chimney 14 can be retractable, that is to say foldable. Thus, the chimney 14 can be retracted in order to facilitate the loading and unloading operations of the removable tools 100, and deployed during the operation of the CVI oven 10. Such a chimney 14 thus allows to further limit or even eliminate the circulation of reactive gases in the enclosure of the oven 10, even depleted, further reducing the clogging of the oven 10.

According to a particular embodiment of the invention, an inert gas, for example nitrogen, can circulate in the enclosure of the CVI oven 10 outside the removable tool 100, in order to limit backscattering of reactive or produced species towards any heating walls of the CVI oven 10.

According to another particular embodiment of the invention, in which the removable tool 100 comprises electrical connection terminals 150, each CVI oven 10 may include electrical connection terminals 15. When the removable tool 100 is arranged in such a CVI oven 10, the electrical connection terminals 150 of the removable tool 100 can be connected to the electrical connection terminals 15 of the CVI oven 10. Thus, the removable tool 100 can act as a resistance and can therefore heat the one or more fibrous preforms 5 present in the reaction chamber 120 as well as the gases present in the removable tool 100. In this particular embodiment of the invention, it is therefore not necessary for the CVI oven 10 to be capable of heating. The CVI oven 10 then performs a thermal insulation function.

As illustrated in FIG. 3, the installation 1 preferably comprises at least one preheating oven 20, allowing to heat the removable tool 100. Thus, the presence of a preheating oven 20 allows to simply raise the temperature of the fibrous preforms 5 and possibly gas(es) present in the removable tool 100 before their consolidation or densification, without requiring the use of a CVI oven 10. Thus, the operation of raising the temperature of the fibrous preforms 5 and possibly gas(es) does not block a CVI oven 10, which can remain dedicated to consolidation or densification. The preheating oven 20 can thus have a simpler configuration than the CVI oven(s) 10, because it does not require a gas injector, gas pumping or evacuation system.

According to a particular embodiment of the invention, in which the removable tool 100 comprises electrical connection terminals 150, each preheating oven 20 may include electrical connection terminals. When the removable tool 100 is placed in such a preheating oven 20, the electrical connection terminals 150 of the removable tool 100 can be connected to the electrical connection terminals of the preheating oven 20. Thus, the removable tool 100 can act as a resistance and can therefore heat the fibrous preform(s) 5 present in the reaction chamber 120 and possibly the air present in the removable tool 100. In this particular embodiment of the invention, it is therefore not necessary for the preheating oven 20 to be capable of heating. The preheating oven 20 then performs a thermal insulation function.

As illustrated in FIG. 3, the installation 1 preferably comprises at least one cooling cell 30, allowing to cool the removable tool 100 preferably in an accelerated manner. Thus, the presence of a cooling cell 30 allows to simply cool the densified or consolidated parts and possibly the gas(es), without requiring the occupation and cooling of a CVI oven 10. Thus, the operation of cooling the densified or consolidated parts does not block a CVI oven 10, which can remain dedicated to consolidation or densification.

The cooling cell 30 can also allow to load a removable tool 100 before its transfer into the preheating oven 20 or into a CVI oven 10 via the transfer tunnel 50. By proceeding in this way, the thermal losses of the preheating oven 20 or CVI oven 10 compared to if said preheating oven 20 or CVI 10 was directly open to the outside are limited. The cooling cell 30 can also allow to evacuate the oxygen present in the removable tool 100 before it enters the rest of the installation 1.

An example of a method for manufacturing at least one composite material part will now be described in relation to the example of installation 1 illustrated in FIG. 3.

According to a first step of the method of the invention, the load is prepared. Thus, at least one fibrous preform 5 or 6 as defined above is loaded into the reaction chamber 120 or 220 of a removable tool 100 or 200 according to the invention. The fibrous preform(s) 5 or 6 can be loaded alone, or held in one or more shapers 7 or 8. The fibrous preform(s) 5 or 6 are arranged in the reaction chamber 120 or 220, with or without shaper 7 or 8, so that the perforations of the first and second plates 115, 215 and 125, 225 allow the passage of the gas(es) into the fibrous preform 5 or 6.

According to a second step of the method of the invention, a preheating step is carried out. The removable tool 100 or 200 can be arranged in a preheating oven 20 via a door 20a belonging to the preheating oven 20, in order to bring it to the desired temperature. Preferably, the removable tool 100 or 200 is previously arranged in the cooling cell 30, where any oxygen present in the removable tool 100 or 200 can be evacuated, before being transferred to the preheating oven 20 through a door 20b thanks to the transfer tunnel 50. Indeed, opening the preheating oven 20 through the door 20a which opens onto the outside of the installation 1 can cause significant heat losses.

If the removable tool 100 or 200 comprises electrical connection terminals 150 or 250 and if the preheating oven 20 comprises electrical connection terminals, the terminals 150 or 250 of the removable tool 100 or 200 can be connected to the terminals of the preheating oven 20. The removable tool 100 can then heat the fibrous preform(s) 5 or 6 and possibly the air present in the removable tool 100 or 200, the preheating oven 20 being able to also heat or only perform a thermal insulation function. The removable tool 100 or 200 can also be brought to a desired pressure.

When the removable tool 100 or 200 has reached the desired temperature and possibly the desired pressure, it is unloaded from the preheating oven 20 to be loaded into a CVI oven 10. The transfer of the removable tool 100 or 200 from the preheating oven 20 in the CVI oven 10 can be carried out through a fixed or removable transfer tunnel. The transfer tunnel 50 is arranged so as to form a sealed contact between a door 20b of the preheating oven 20, preferably distinct from the door 20a through which the removable tool 100 or 200 had been loaded, and said tunnel. Likewise, the transfer tunnel 50 is arranged so as to form a sealed contact between a door 10a of the CVI oven 10, preferably distinct from the door 10b through which the maintenance and preparation operations of the CVI oven 10 are carried out, and said tunnel. Thus, the removable tool 100 or 200 can be transferred from the preheating oven 20 to the CVI oven 10 via the transfer tunnel 50 while limiting temperature and pressure losses as much as possible.

The removable tool 100 or 200 may not be heated beforehand in a preheating oven 20, to be loaded directly into a CVI oven 10. In this case, this preliminary heating step is carried out directly in the CVI oven 10. If the removable tool 100 or 200 comprises electrical connection terminals 150 or 250 and if the CVI oven 10 comprises electrical connection terminals 15, the terminals 150 or 250 of the removable tool 100 or 200 can be connected to the terminals 15 of the CVI oven 10. The removable tool 100 or 200 can then heat the fibrous preform(s) 5 or 6 and possibly the air present in the removable tool 100 or 200, the CVI oven 10 being able to also heat or only perform a thermal insulation function during this preliminary heating step. The removable tool 100 or 200 can also be brought to a desired pressure.

According to a third step of the method of the invention, the fibrous preform(s) 5 or 6 are consolidated or densified. The removable tool 100 or 200 has thus been loaded into a CVI oven 10. The removable tool 100 or 200 is arranged in the CVI oven 10 so that the gas inlet orifice(s) 111 or 211 of the removable tool 100 or 200 are placed in the extension of the gas injector(s) 11 of said oven 10. Preferably, the connection between the gas inlet orifice(s) 111 or 211 of the removable tool 100 or 200 and the gas injector(s) 11 of said oven 10 is sealed. Furthermore, the removable tool 100 or 200 is arranged in the CVI oven 10 so that the gas outlet orifice(s) 131 or 231 of the removable tool 100 or 200 are placed opposite the ejection cone 13 of said oven 10. If the CVI oven 10 comprises a retractable chimney 14, said chimney is deployed as close as possible to the gas outlet orifice(s) 131 or 231 of the removable tool 100 or 200, preferably so to form a tight contact around the gas outlet orifice(s) 131 or 231. Such an installation allows to strongly limit, or even prevent, the circulation of reactive gases— even depleted—in the CVI oven 10. Clogging of the CVI oven 10 is therefore very small, and the CVI oven 10 can therefore be used for longer periods of time without requiring cleaning or maintenance operations.

If the removable tool 100 or 200 comprises electrical connection terminals 150 or 250 and if the CVI oven 10 comprises electrical connection terminals 15, the terminals 150 or 250 of the removable tool 100 or 200 can be connected to the terminals 15 of the CVI oven 10. The removable tool 100 or 200 can then heat the fibrous preform(s) 5 or 6 and possibly the reactive gas(es) present in the removable tool 100 or 200, the CVI oven 10 being able to also heat or only perform a thermal insulation function during the consolidation or densification step. The removable tool 100 or 200 can also be brought to a desired pressure.

One or more reactive gases containing one or more precursors of the matrix material to be deposited are injected by the gas injector(s) 11 of the CVI oven 10 and introduced into the homogenization chamber 130 or 230 of the removable tool 100 or 200 via the gas inlet orifice(s) 111 or 211 of said tool 100 or 200. In the case of a ceramic material, such as silicon carbide (SiC), methyltrichlorosilane (MTS) can be used as a silicon carbide (SiC) precursor in a manner well known per se. In the case of carbon for example, use is made of gaseous hydrocarbon compounds, typically propane, methane or a mixture of the two.

The temperature, pressure and composition of the reactive gas(es) is homogenized in the homogenization chamber 130 or 230 of the removable tool 100 or 200. Then, the homogenized reactive gas(es) enter the reaction chamber 120 or 220 of the removable tool 100 or 200 via the perforations present in the first perforated plate 115 or 215.

The consolidation or densification of each fibrous preform 5 or 6 is ensured, in a manner well known per se, by deposition within said preform of the material of the matrix produced by decomposition of the precursor(s) contained in the reactive gas(es) diffusing inside the accessible internal porosity of each preform 5 or 6.

The reactive gas(es) then enter the depletion chamber 130 or 230 of the removable tool 100 or 200 via the perforations present in the second perforated plate 125 or 225, where they are depleted and where the reactive chemical species present in said gases finish being consumed.

Finally, the depleted reactive gas(es) are sucked through the gas outlet orifice(s) 131 or 231 towards the ejection cone 13 of the CVI oven 10, preferably via the retractable chimney 14.

According to a fourth step of the method of the invention, the removable tool 100 or 200 is cooled. Preferably, the cooling of the removable tool 100 or 200 is carried out in a cooling cell 30 of the installation 1. The removable tool 100 or 200 is then unloaded from the CVI oven 10 via the door 10*a* belonging to the CVI oven 10. The transfer of the removable tool 100 or 200 from the CVI oven 10 to the cooling cell 30 can be carried out via a transfer tunnel, which is fixed or removable. The transfer tunnel 50 is arranged so as to form a sealed contact between a door 10*a* of the CVI oven 10, preferably distinct from the door 10*b* through which the maintenance and preparation operations of the CVI oven 10 are carried out, and said tunnel. Likewise, the transfer tunnel 50 is arranged so as to form a sealed contact between a door 30*a* of the cooling cell 30, preferably distinct from the door 30*b* through which the removable tool 100 or 200 will be unloaded from said cell 30, and said tunnel.

The removable tool 100 or 200 may not be cooled outside a CVI oven 10, but be cooled inside the CVI oven 10.

According to a fifth step of the method of the invention, the consolidated or densified parts are released. Thus, the cooled removable tool 100 or 200 is removed from the cooling cell 30, or from the CVI oven 10, then the consolidated or densified part(s) are removed from the removable tool 100 or 200.

The installation 1 according to the invention can also allow to consolidate then densify fibrous preforms, by carrying out these two operations in the CVI ovens 10 of the installation 1. In the case where a fibrous preform is consolidated by the installation 1 according to the invention, it can then be densified by gas, liquid or solid means in a well-known manner.

The installation according to the invention allows to densify fibrous preforms by gas. The installation according to the invention thus allows to form parts made of composite material, in particular ceramic matrix composites (CMC) such as SiC/SiC or C/SiC composites. The removable tool and the installation according to the invention thus allow in particular, but not exclusively, to produce composite material parts having excellent mechanical properties at high temperature and in an oxidizing environment, such as for example aeronautical engine parts.

The invention claimed is:

1. An installation for consolidation or densification by chemical infiltration in a gas phase comprising:
   at least one removable tool for consolidation or densification in the gas phase of at least one fibrous preform, the removable tool being configured to be arranged in an oven, the removable tool comprising a homogenization chamber comprising at least one gas inlet orifice and a depletion chamber comprising at least one gas outlet orifice, the removable tool further comprising a reaction chamber arranged between the homogenization chamber and the depletion chamber and configured to receive at least one fibrous preform, the reaction chamber being separated from the homogenization chamber and the depletion chamber by perforated plates, at least one CVI oven comprising at least one gas injector and a gas evacuation system, the CVI oven being able to receive the removable tool so that at least one gas inlet orifice of the removable tool is connected to at least one gas injector of the CVI oven, the CVI oven being configured to heat or thermally insulate said removable tool, at least one preheating oven capable of receiving a removable tool and configured to preheat or thermally insulate said removable tool, the preheating oven being devoid of a gas injector, gas pumping or evacuation system, and at least one cooling cell capable of receiving a removable tool and configured to cool said removable tool.

2. The installation according to claim 1, wherein the removable tool is made at least partially of conductive material and comprises electrical connection terminals.

3. The installation according to claim 1, wherein the removable tool is made of graphite.

4. The installation according to claim 1, said installation further comprising at least one transfer tunnel configured to allow the movement of the removable tool at least between the CVI oven and another CVI oven, a preheating oven or a cooling cell.

* * * * *